United States Patent [19]

Kolibas

[11] 4,433,296

[45] Feb. 21, 1984

[54] ELECTROSTATIC SYSTEM ANALYZER

[75] Inventor: James A. Kolibas, Broadview Heights, Ohio

[73] Assignee: Nordson Corporation, Amherst, Ohio

[21] Appl. No.: 285,740

[22] Filed: Jul. 22, 1981

[51] Int. Cl.³ .......................................... G01N 27/60
[52] U.S. Cl. .................................. 324/452; 324/133; 324/149
[58] Field of Search ..................... 324/452, 133, 149; 242/107

[56] References Cited

U.S. PATENT DOCUMENTS

| 2,640,093 | 5/1953 | Herold | 324/149 |
| 3,315,163 | 4/1967 | Lutz | 324/149 |
| 3,612,999 | 10/1971 | Bergero | 324/149 |
| 3,929,210 | 12/1975 | Cutler et al. | 242/107 |

Primary Examiner—Michael J. Lynch
Assistant Examiner—Kevin D. O'Shea
Attorney, Agent, or Firm—Wood, Herron & Evans

[57] ABSTRACT

An electrostatic system analyzer for checking the voltage at various test points in a high voltage electrostatic spray coating system. The analyzer is in the form of a gun having a telescoping cylindrical barrel with an exposed electrode at its forward end, and a meter at its rearward end, and having a downwardly extending conductive handle. The forward portion of the analyzer body, which is axially and angularly movable relative to the rearward portion, includes a conductive receptacle electrically connected to the electrode, and the rearward portion of the analyzer body includes four axial bores equidistant from a central axis and equiangularly arrayed thereabout. Each bore contains a resistor, and the resistors are electrically connected in series, with three of the resistors each having an individual plug extending toward the forward analyzer body portion and being receivable for electrical contact within the receptacle when the two portions are telescoped together. The particular resistor coupled to the electrode through the receptacle and its associated plug is determined so as to introduce sufficient resistance from the series of resistors to compensate for resistance variations at different test points in the electrostatic system.

10 Claims, 12 Drawing Figures

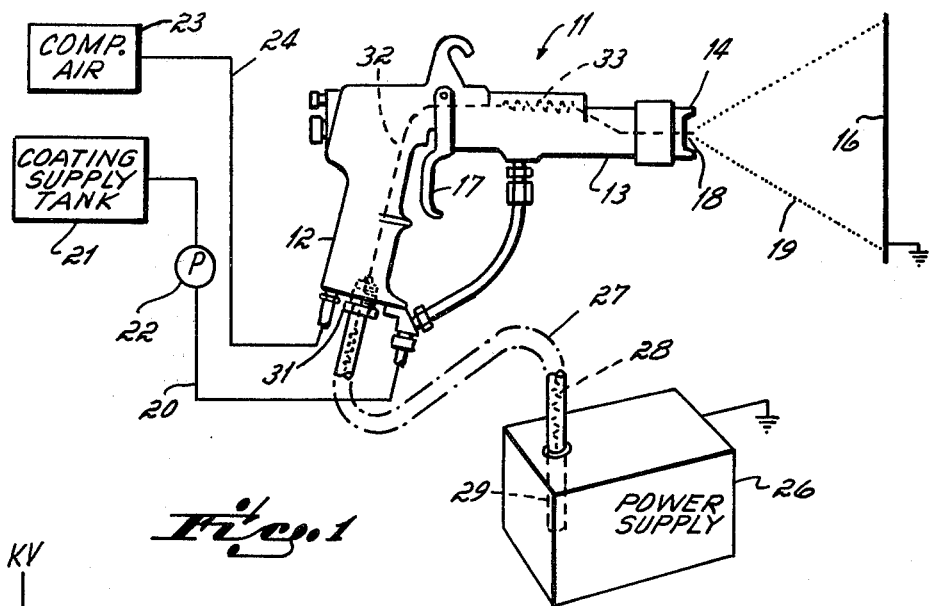
Fig. 1
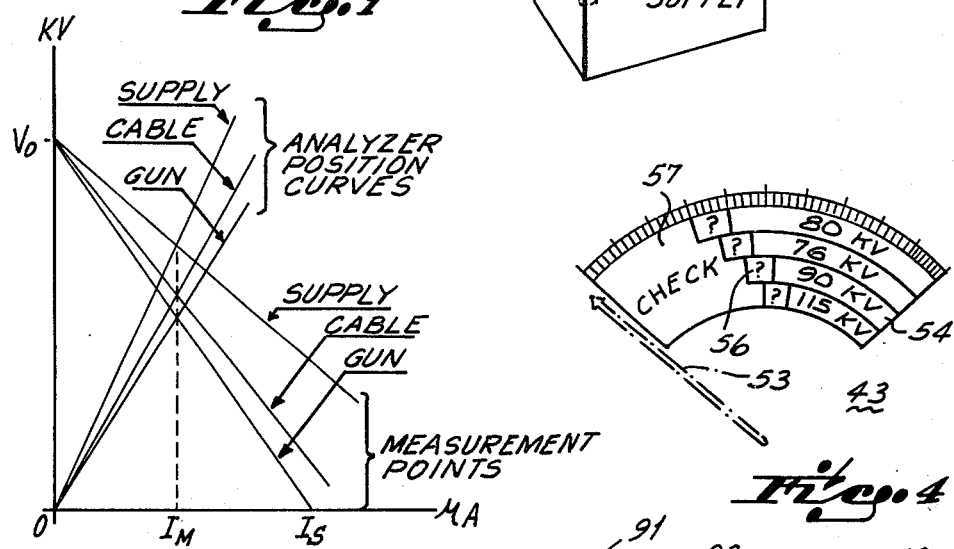
Fig. 2
Fig. 4
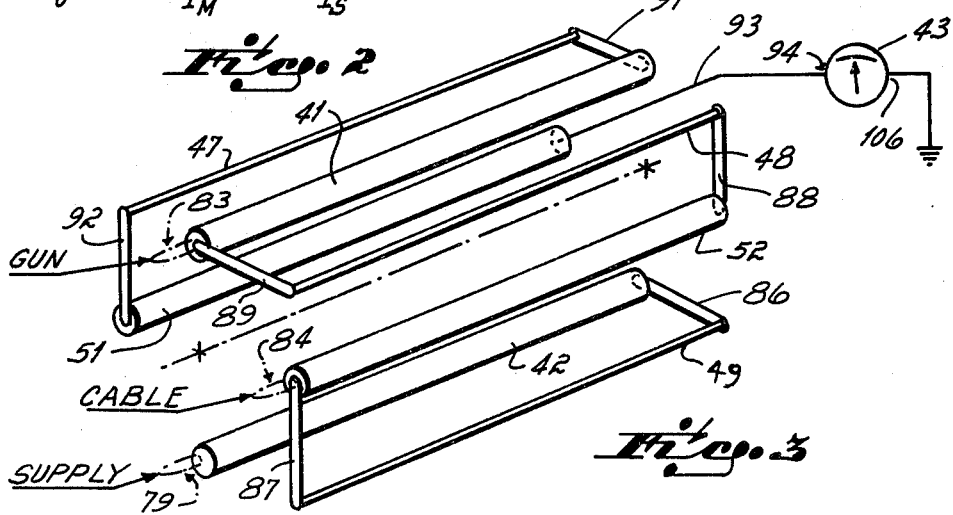
Fig. 3

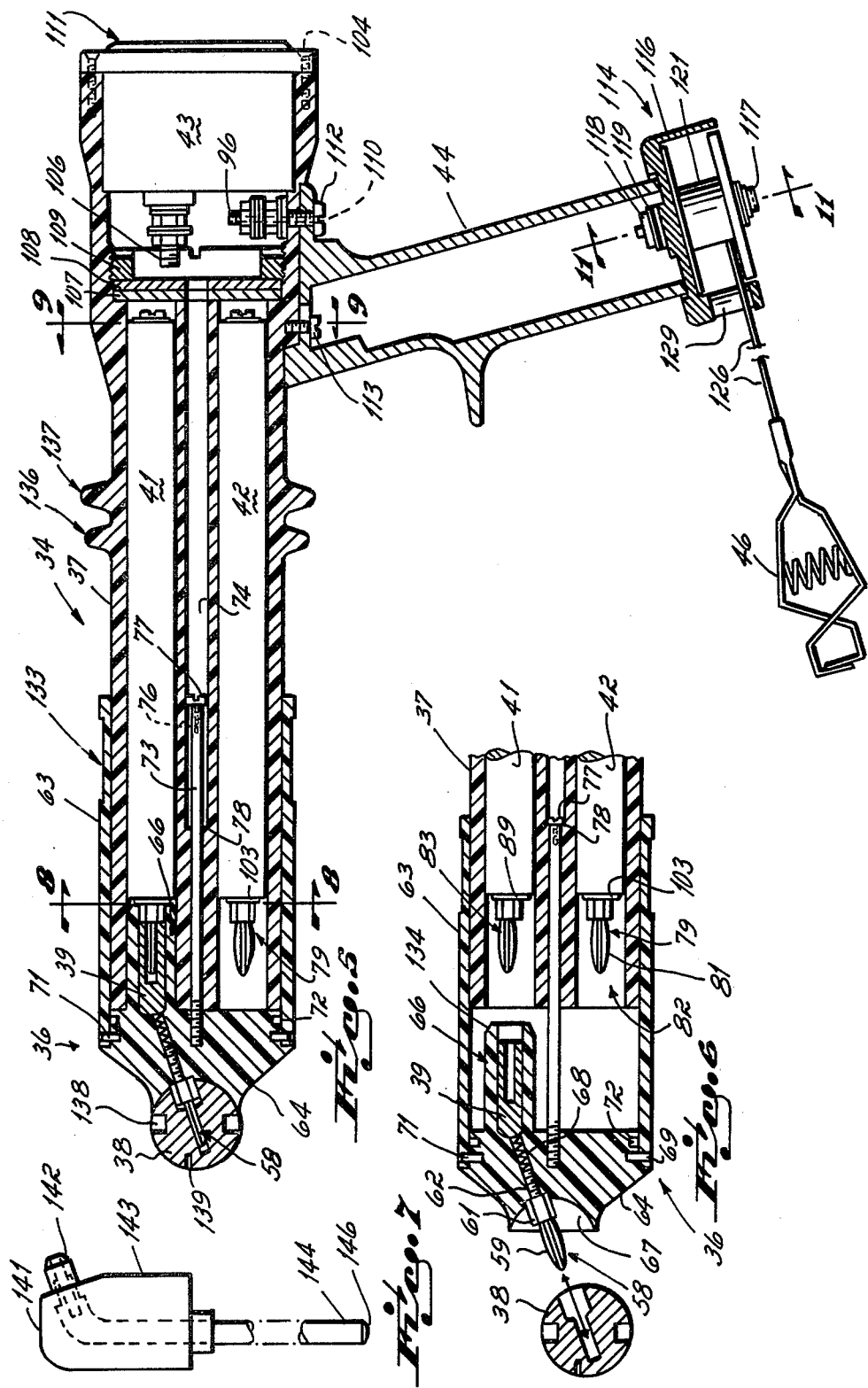

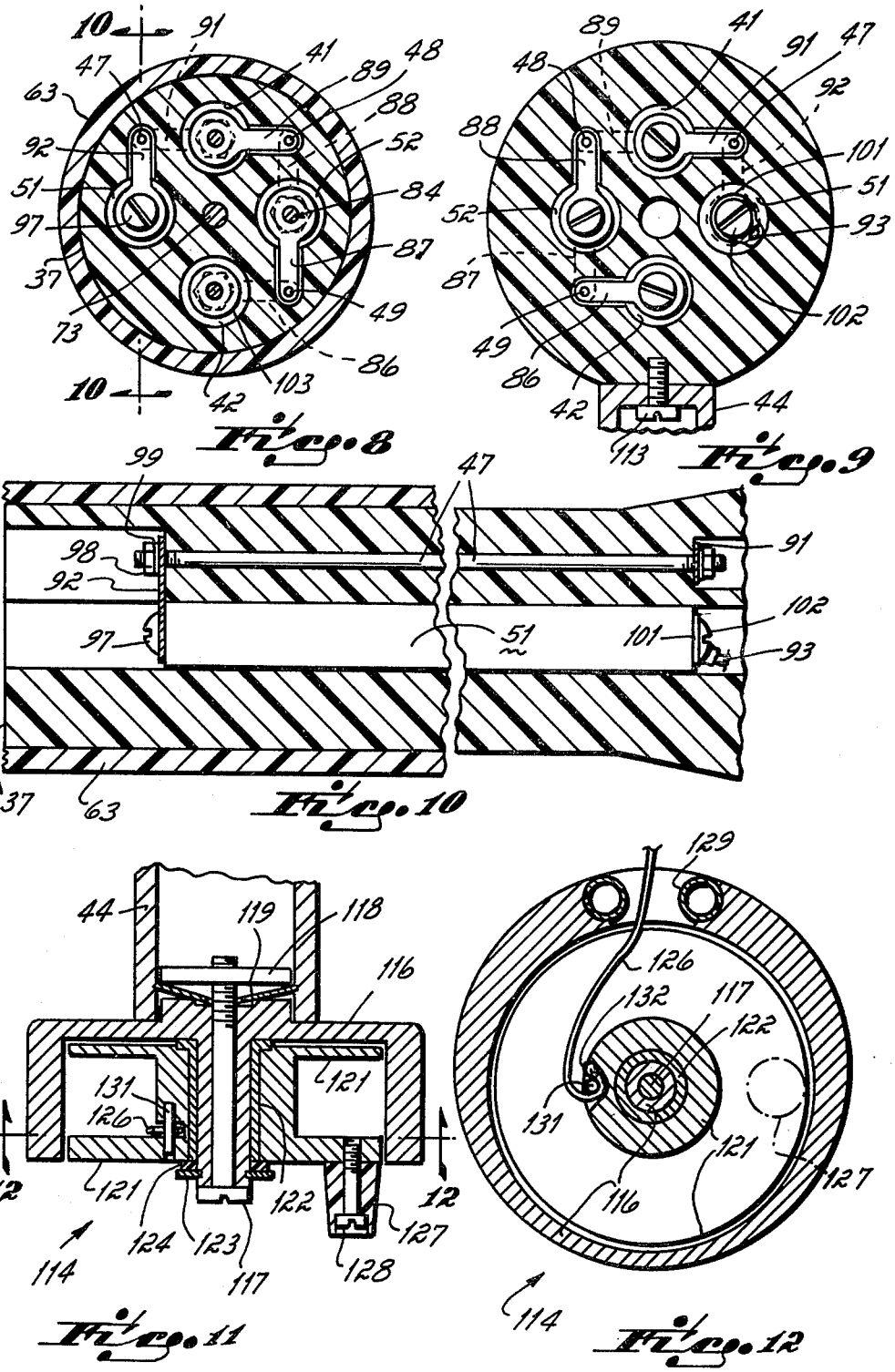

ELECTROSTATIC SYSTEM ANALYZER

DESCRIPTION OF THE INVENTION

This invention relates generally to high voltage electrostatic spray coating systems and more particularly concerns an analyzer for checking the voltage at various test points in such a system.

Electrostatic spray coating systems include as principle components thereof an electrostatic spray gun, a power supply, and a cable for coupling power from the power supply to the gun. In order to maintain proper spraying efficiency, the voltage at a spray gun electrode located near the spray gun nozzle must be kept at a satisfactory level. At times when the spray coating efficiency is unsatisfactory the electrostatic supply system must be checked to determine if there has been a loss of the requisite spray gun electrode voltage and, if so, at what point in the system the voltage breakdown has occurred. At other times the voltages at various test points in the electrostatic coating system are checked as a part of the routine maintenance of the coating system.

In checking the voltages in the electrostatic coating system typically the voltage at the spray gun electrode is first checked, then the voltage at the gun end of the cable after it has been disconnected from the gun, and finally the voltage at the electrostatic power supply, in order to isolate the location of a voltage problem should there be one.

Due to the voltages involved in high voltage electrostatic spray coating systems, typically on the order of 50–125 kilovolts, a voltmeter is not employed for checking the voltage at test points in the electrostatic system. Instead an ammeter is coupled between each test point and ground through a large series resistance, with the meter providing an indication of the amount of current drawn through the meter and the series resistor. The face of the meter is calibrated in terms of voltage rather than current, utilizing the ohmic relationship between voltage and current. With a known resistance in series with the ammeter the calibration of the meter face in terms of voltage is substantially straightforward.

If the cable and gun exhibited negligible electrical resistance, the full electrostatic voltage from the power supply would be provided at the gun electrode since there would be virtually no voltage drop between the power supply and the gun electrode. Under such circumstances, a person utilizing the meter would need only to know the output voltage of the power supply for the particular system being tested and would look for this same voltage at each test point.

Unfortunately, for safety reasons, significant resistances are intentionally provided in both the cable and the spray gun in a typical electrostatic spray coating system. Such resistances are added to the gun and cable to limit undesirable current leakage, and to minimize the effect of accidental discharge of electrical energy capacitively stored in the gun and cable should the operator inadvertently contact the gun electrode with a grounded object or himself.

When current is drawn from different test points in an electrostatic spray system, which test points are electrically separated from the power supply by different resistances, the voltage readings obtained with the above-described electrostatic voltage test scheme incorporating an ammeter arrangement will differ from point to point notwithstanding that the high voltage provided by the power supply is not changing. Therefore, knowledge of the output voltage of the power supply is of itself insufficient to indicate acceptable operating voltages at other points in the system. In order to deal with this problem presently, the above described voltage checking system is used in combination with a chart to cross-reference acceptable ranges of readings at different test points for different electrostatic spray coating systems exhibiting different power supply output voltages. As can be appreciated, such a chart is cumbersome to use. The operator, in addition to making each voltage check by contacting a high voltage test point with the meter electrode and reading the output indication on the meter, must also consult a chart to convert the actual voltage indicated by the meter to a "corrected" voltage which compensates for the differing voltage drops which are present at different test points.

It is consequently an object of the present invention to provide an analyzer for checking the voltage at various test points in an electrostatic spray coating system which compensates for varying voltage drops in the system regardless of the test point checked.

Briefly, this object of the invention is provided by an analyzer for a high voltage electrostatic coating system incorporating a plurality of resistors connected in series with an ammeter, and further incorporating means for coupling a test electrode to different resistors in the series of resistors dependent upon the test point selected.

Other objects and advantages of the invention will become apparent upon reading the following detailed description and upon reference to the drawings, in which:

FIG. 1 is a schematic illustration of an electrostatic spray coating system;

FIG. 2 is a graph illustrating the volt-amp characteristics of different test measurement points and different analyzer settings for an analyzer in accordance with the present invention;

FIG. 3 is a diagrammatic illustration of the series connected resistors in accordance with an embodiment of the present invention;

FIG. 4 is an illustration of a meter face on an analyzer in accordance with the present invention;

FIG. 5 is a side cross-sectional view of an analyzer embodying the present invention;

FIG. 6 is a side cross-sectional view of the front portion of the analyzer of FIG. 5 with the two portions of the analyzer body in an extended orientation;

FIG. 7 is a side elevational view of an alternate electrode probe for the analyzer of FIG. 5;

FIG. 8 is a front cross-sectional view of the analyzer of FIG. 5 taken along the line 8—8;

FIG. 9 is a rear cross-sectional view of the analyzer of FIG. 5 taken along the line 9—9;

FIG. 10 is a partial cross-sectional view of the analyzer of FIG. 5 showing the relative positioning between a resistor and a connecting rod in the analyzer body;

FIG. 11 is a cross-sectional view of the ground strap takeup reel on the analyzer of FIG. 5 taken along the line 11—11; and FIG. 12 is a cross-sectional view of the takeup reel of FIG. 11 taken along the line 12—12.

While the invention is susceptible to various modifications and alternative forms, a specific embodiment thereof has been shown by way of example in the drawings and will herein be described in detail. It should be understood, however, that it is not intended to limit the invention to the particular form disclosed, but, on the contrary, the intention is to cover all modifications, equivlants, and alternatives falling within the spirit and scope of the invention as defined by the appended claims.

Referring to FIG. 1, a typical electrostatic spray coating system includes an electrostatic spray gun 11 having a handle 12 designed to be manually grapsed in use by an operator, and a barrel 13 terminating at its forward end in a nozzle 14. A spray of finely divided, or atomized, particles of coating material flows from the nozzle 14 toward an object 16 to be coated when the gun trigger 17 is activated by the operator. An electrode 18, electrically insulated from the gun handle 12, trigger 17, and barrel 13, is mounted in the nozzle 14 and maintained at a high negative DC potential for charging the coating particles in the spray 19 as they leave the nozzle 14. Charging of the coating particles enhances, for reasons well known in the art, the deposition of the coating particles on the article 16 being coated, which is maintained at an electrical potential different from that of the electrode 18, such as at a ground potential.

A source of coating material in the form of a supply tank 21 is connected by a suitable fluid conduit 20 to the barrel 13 of the gun 11. A pump 22, connected in the line 20 between the tank 21 and the gun barrel 13, supplies the fluid to the gun barrel. In the system illustrated a source of pressurized air 23 is coupled through a suitable line 24 to the gun barrel 13 to facilitate atomization of the coating material. In an "airless" spray system, the pressurized air source 23 is omitted and the pump 22 suitably pressurizes the coating material to facilitate atomization of the coating material by the nozzle 14 without the need for an auxiliary source of pressurized air.

A high voltage DC power supply 26 provides the high DC potential for the electrode 18 in the nozzle 14. The output of power supply 26 is coupled to the gun 11 through a coaxial cable 27 having internal resistance such as 28. One end of the cable 27 is received in a well 29 for electrical coupling to the output of the power supply 26. The other end of the cable 27 is connected by a fitting 31 to the gun 11. The DC potential at the gun end of the cable 27 is insulated from the gun handle 12, barrell 13 and nozzle 14. The DC potential at the cable end is coupled through an insulated conductor 32 and at least one resistor 33 to the electrode 18. As indicated earlier the resistance is added to the cable 27 and in the conductive path 32 in order to minimize the dangers of discharge and leakage. Typically the output of the power supply 26 is supplied through a high internal resistance.

The typical test points for checking the voltage of the system of FIG. 1 are at the electrode 18 (which shall be referred to herein as a gun measurement), at the gun end of the cable 27 after the cable has been disconnected from the gun (which measurement shall be referred to herein as a cable measurement), and at the output of the power supply 26 in the well 29 (which shall be referred to herein as a supply measurement).

Referring now to FIG. 5, an analyzer 34 constructed in accordance with the present invention has a tubular body with a first portion 36 telescopically received on a second portion 37. The first analyzer body portion 36 carries an analyzer electrode 38 which is electrically connected to a conductive receptacle 39. The second body portion 37 contains four resistors such as 41 and 42 which are electrically connected in series with the series arrangement being further connected in series with an ammeter 43 to a conductive handle 44. In a manner to be described hereinafter, the receptacle 39 is operable to be coupled to different ones of the resistors such as 41 and 42 dependent upon the angular orientation of the body portion 36 relative to the body portion 37. The first body portion 36 shall be referred to hereinafter as a sleeve 36 received on the body 37 (second body portion) of the analyzer 34.

In operation, the handle 44 of the analyzer is connected to ground by a ground clip 46, and a circuit through the analyzer is established when the electrode 38 contacts a test point in the electrostatic spray coating system. The circuit established is through the electrode 38, the receptacle 39, some or all of the series resistors such as 41 and 42, the ammeter 43, the handle 44, and the ground clip 46 to ground. As shall be described more particularly hereinafter, the proper receptacle-resistor connection is determined dependent upon the test point in the electrostatic spray coating system which is to be checked.

In FIG. 3 the relative positions of the four resistors in the analyzer 34 are illustrated together with a representation of the resistor series connections. The series connections between the resistors are effected by three conductive rods 47–49 lying parallel to and spaced apart from the resistors in the analyzer body 37. Tracing the series resistor connection from the meter 43, the ungrounded terminal 94 of the meter is connected to the rearward end of a resistor 51 which is connected at its forward end to the conductive rod 47. The conductive rod 47 is connected at its rearward end to the resistor 41 which is connected at its forward end to the conductive rod 48. The conductive rod 48 is connected at its rearward end to a resistor 52 which is connected at its forward end to the conductive rod 49. The conductive rod 49 is connected at its rearward end to the resistor 42. Each of the resistors 41, 42 and 52 has a plug at its forward end for coupling through the receptacle 39 and the analyzer electrode 38. The plugs on the ends of the resistors 41, 52, and 42 are connected to the receptacle 39 when the sleeve 36 is rotated to its gun, cable and supply positions, respectively.

With reference now to FIG. 2, the manner in which substantially consistent analyzer readings may be taken at different test points in the electrostatic spray coating system shall be described. Somewhat idealized volt-amp characteristics of the electrostatic system at the gun, cable and supply measurement points are illustrated on a scale of kilovolts versus microamps. The open circuit voltage $V_0$ is generally on the order of 50 to 125 kilovolts. The intersection point between each system characteristic line and the x axis is the short circuit current, which is generally in the range of up to about 250 microamps. The short circuit current at the gun electrode is indicated as $I_s$.

It can be seen that the characteristic curves for different measurement points in the electrostatic coating system begin at a common ordinate $V_0$ since the open circuit voltage is the same at each point. The curves have a decreasing (negative) slope as one moves from the gun measurement point to that of the cable and then the supply. The slope change is, of course, due to the above described resistance differences among these measurement points.

Also shown in FIG. 2 are a set of three analyzer curves for the different setting positions of the analyzer. The gun, cable, and supply curves are indicative of the resistance slopes when the analyzer electrode is coupled to the gun, cable and supply resistor plugs (FIG. 3), respectively. The curves have an increasing slope as resistance is added by moving from the gun to the cable to the supply position on the analyzer.

Preferably, the resistance values which are added in series with the meter in the analyzer in the cable and supply positions correspond respectively to the amounts of resistance removed from the electrostatic system when the gun and the cable are removed. This means that the resistor 52 corresponds to the internal resistance of the gun 11 and that the resistor 42 corresponds to the resistance in the cable 27. If this is the case, the current through the analyzer meter 43 will be the same when the analyzer is in the gun position when measuring at the gun measurement point, in the cable position measuring at the cable measurement point, and in the supply position measuring at the supply measurement point. This current is indicated as $I_m$ in FIG. 2.

In this way, a consistent reading on the meter 43 can be obtained even though the actual voltages measured at the different points differ from one another. An alternative manner of viewing the substitution of the resistances 52 and 42 into the measurement circuit is from the reference point of the gun plug end of the resistor 41. With this point as a reference, the gun analyzer curve may be considered to be the only analyzer curve, and the introduction of the resistors 52 and 42 to compensate for the removal of the resistance of the gun 11 and the cable 27 may be deemed to shift the supply and cable measurement point characteristics down onto the gun measurement point characteristic so that there is in effect a single measurement characteristics as well. This analysis leads, of course, to the same meter current $I_m$ at the intersection between the two gun characteristic curves in FIG. 2.

It can be shown that for different open circuit voltages $V_0$, if the gun and cable resistances are generally similar to the resistances 52 and 42 in the analyzer, a typical acceptable meter current $I_m$ may be defined. Dependent upon the gun and cable impedances and the internal impedance of the power supply, minimum acceptable ammeter currents for different systems may be empirically determined. These ammeter currents correspond to different ammeter indications for which the face of the ammeter may be calibrated as illustrated in FIG. 4.

In FIG. 4, the face of the meter 43 is marked to indicate four different electrostatic coating systems which might be checked with an analyzer 34. In the case, for example, of a 90 kilovolt system, if measurements at the gun, cable and supply positions deflect the ammeter needle 53 into the area 54, the functioning of the system components is acceptable. A reading in the area 56 would indicate the possibility of a faulty or dirty component, and a reading in the area 57 would indicate that the system should be checked for a faulty or dirty component. The system is then checked at the various test points in order to isolate the source of the fault. For example, if a reading in the area 57 were obtained upon taking a gun measurement and a reading in the area 54 were obtained in taking a cable measurement, the faulty component would be the gun. It can be seen from the meter face markings that the acceptable ammeter reading decreases as the open circuit voltage of the system decreases moving from a 115 kilovolt system to a 90 kilovolt system to a 76 kilovolt system. The 80 kilovolt system illustrated includes in its acceptable range even lower currents than those for the 76 kilovolt system. This situation might arise in a case where the higher open circuit voltage system also had a higher internal resistance.

With reference now to FIGS. 5–12, a preferred form of the analyzer 34 shall be described in more detail. As indicated earlier the analyzer 34 includes the generally cylindrical body 37 in which are received four resistors such as 41 and 42 and an ammeter 43. The sleeve 36 is telescopically received on the body 37, and the sleeve 36 carries an electrode 38. The resistors are conected in series with the ammeter to a groundable handle 44, and the potential to be measured is coupled to this series connection through the electrode 38 and a receptacle 39 which is operable to engage a selected one of the resistors.

In order to electrically connect the analyzer electrode 38 to the resistor-engaging receptacle 39, the ball electrode 38 is received on a banana plug 58 having a spring plug portion 59, a hex nut portion 61 and a threaded stud 62. The sleeve 36 is made up of a tube 63 and an attached head 64 carrying both the plug 58 and the receptacle 39. The receptacle 39 is press fit into a cylindrical extension 66 extending toward the body 37 inside the sleeve 36.

An aperture extends through the head 64 from the receptacle 39 to the arcuate socket 67 in which the ball electrode 38 is received. The plug 58 is threadedly received in the aperture with the stud portion 62 of the plug bearing against a compression spring 68 located in the hole. The spring is compressed between the stud 62 and the receptacle 39, thereby insuring electrical contact therebetween.

The tube portion 63 of the sleeve 36 is press fit onto the head 64 and pinned thereto at 69 and 71. An O-ring seal 72 is provided about the periphery of the head 64 in contact with the interior surface of the tube 63. The interior cylindrical surface of the sleeve 36 is telescopically received on the outer cylindrical surface of the body 37 of the analyzer for axial movement and angular rotation relative thereto. In order to retain the sleeve 36 on the body 37, a shank 73 carried in a central axial bore 74 in the body 37 is threadedly received at its forward end in the head 64 of the sleeve 36. A screw is threadedly received in a bore 76 in the shank 73 at its rearward end. The head 77 of the screw has a diameter slightly less than that of the bore 74. As the sleeve 36 is moved forwardly away from the body 37, the head 77 of the screw 76 contacts an annular shoulder 78 along the bore 74, thereby limiting the movement of the sleeve 36 relative to the body 37 and preventing the removal of the sleeve.

The body 37 also defines four axial bores for the four resistors 41, 42, 51 and 52 carried in the analyzer. The axes of these cylindrical bores are equidistant from the central axis in the bore 74 and are also equiangularly disposed about this central axis. The analyzer body 37 further includes three axial bores receiving the connecting rods 47–49 for effecting the series connection of the resistors.

The resistors and the rods are maintained in a framework by a series of tabs, to be described hereinafter, with the framework of resistors and rods being thereby retained witin the analyzer body 37. Each of the resistors 41, 42 and 52 has a banana plug at its forward end with the plug portion being directed toward the receptacle 39. For example, a banana plug 79 having a plug portion 81 is threadedly received and retained in the forward end of the resistor 42. The radial spacing of the axis of cylindrical portion 66 of the head 64 from the central axis of the bore 74 is the same as that for the axes of the resistors. Therefore, the sleeve 36 may be rotated relative to the body 37 to position if the cylindrical portion 66 in alignment with one of the resistor bores, such as the bore 82 for the resistor 42. Subsequently, the sleeve 36 and body 37 are moved together so that the plug portion 81 is engaged by the receptacle 39. This establishes electrical contact between the forward end of the resistor 42 and the analyzer electrode 38. The resistor 41 has a plug 83 at its forward end, and the resistor 52 has a plug 84 at its forward end, both of which are also engageable by the receptacle 39.

The highest resistance path through the resistors in the analyzer 34 begins at the supply position, which corresponds to the plug 79 at the forward end of the resistor 42. The series circuit from that point runs through the resistor 42, a conductive tab 86, the rod 49, a tab 87, the resistor 52, a tab 88, the rod 48, a tab 89, the resistor 41, a tab 91, the rod 47, a tab 92, the resistor 51, and a cable 93 to the ungrounded terminal 94 of the meter 43, and thence through the meter to a terminal 96 to be coupled to ground.

The end of each tab which contacts a rod 47-49 is retained thereon by a threaded fastener received on a threaded end portion of the rod. The end of each tab which is in contact with a resistor is retained thereon by a screw or, where appropriate, by one of the three banana plugs.

For example, as best shown in FIG. 10, the tab 92 at the forward end of the resistor 51 is attached to the resistor by a screw 97 which passes through an aperture in the tab and is threadedly secured within the resistor 51. The other end of the tab 92 is also apertured and fits over the threaded end of the rod 47 and is secured thereto by a nut 98 and lock washer 99. At the rearward end of the resistor 51 of a tab 101 attached to the wire 93 running to the meter 43 is secured to the resistor by a screw 102.

At the forward end of the resistor 42 the plug 79 is threadedly received in the resistor 42 with an intervening washer 103. At the forward end of the resistor 41 the plug 83 is threadedly received in the end of the resistor with the tab 89 secured therebetween.

The ammeter 43 is mounted in the rear of the analyzer body 37 and secured therein by screws 104. The ammeter has a first terminal 94 coupled to the series resistors through a cable 93, as described above, and a second terminal 106 connected by a wire (not shown) to a grounding screw 96. The meter 43 is isolated from the series resistor arrangement by a disc shaped gasket 107 and and a disc shaped washer 108, both of which are substantially non-conductive and apertured coaxially with the central bore 74 but otherwise solid except for the passage of wire 93 therethrough. The gasket and washer are secured in place against an annular shoulder of the analyzer body by a threaded substantially non-conductive ring-nut 109. The meter 43 has a generally circular face 111 observable by an operator from the rear of the analyzer 34.

In order to ground the terminal 96, and hence the ground-side of the meter 43, the conductive handle 44, which is conveniently gripped by an operator in use of the analyzer 34, is secured to the analyzer body 37 by a hollow screw 112, whose threaded end forms the terminal 96, and a screw 113. The conductive handle 44 is electrically connected to the grounding clip 46 through a reel arrangement indicated generally as 114. The reel arrangement 114 includes a spool housing 116 which is fastened to the handle 44 by a screw 117. The threaded end of the screw 117 is received in a square nut 118 which, upon tightening of the screw 117, forces a spring member 119 into engagement with the handle 44 retaining the housing 116 on the base of the handle 44.

A ground wire spool 121 is rotatably mounted on a bearing 122 on the center of the spool housing 116. A retaining ring 123 and a plastic washer 124 are provided for retaining the spool 121 on the housing 116. The ground clamp 46 is connected to a ground cable 126 which is received on the spool 121 and may be wound and unwound therefrom.

In order to wind and unwind the ground cable 126 a handle 127 is rotatably mounted on a screw 128 which is threadedly received in an aperture in the spool 121. In order to facilitate the rolling and unrolling of the cable 126, and to prevent undue wear on the housing 116, the cable 126 is received in the housing between a pair of roll pins 129. So that the end of the ground cable 126 will remain retained within the reel 121, the end of the cable is passed about a spiral pin 131 and the end 132 of the cable 126 is enlarged such as by the application of solder to prevent its return between the pin 131 and the spool 121.

In order to properly orient the sleeve 36, the sleeve is moved fowardly axially relative to the body 37 and rotated to the appropriate orientation for the particular test point at which the voltage in the electrostatic system is to be checked. To facilitate the selection of the proper angular orientation of the sleeve 36, pictorial or other indicators are applied in a band about the periphery of the sleeve 36 at the location indicated generally as 133. When the proper orientation for the sleeve 36 has been obtained, the sleeve is moved rearwardly, toward the meter 43, onto the body 37 of the analyzer 34. This moves the receptacle 39 in the cylindrical portion 66 of the sleeve head 64 into engagement with the appropriate resistor plug. The movement of the cylindrical portion 66 into the selected axial bore is facilitated by a chamfered edge 134 about the rearward end of the cylindrical portion 66. Air is permitted to freely communicate with the interior of the analyzer body through a bore 110 in the screw 112 so that movement of the sleeve 36 is not opposed by air pressure.

The physical length of the body of the analyzer is reduced by the provision of two annular barriers 136 and 137 along the analyzer body 37 in order to increase the effective electrical length between the electrode 38 and the grounded portions at the rearward end of the analyzer.

The ball electrode 38 conveniently includes at least one large blind hole 138 for engaging the end of the cable 27 in taking a measurement, and at least one smaller blind hole 139 for receiving the electrode 18 at the gun tip. In order to measure the supply voltage in the well 29 of the power supply 26, an alternate electrode assembly 141 is provided, as illustrated in FIG. 7. In order to measure the voltage in the supply well 29, the ball electrode 38 is removed from the plug 58 and replaced by the probe arrangement 141. The probe 141 includes a receptacle 142 for receiving the plug 58 and an insulating housing 143 for coupling the conductor in an insulated probe 144 to the receptacle 142. A generally spherical brass tip 146 at the distal end of the probe arrangement 141 is exposed to contact the electrode in the well 29 of the supply 26. The voltage at the supply is thereby coupled through the cable 144 and the receptacle 142 to the analyzer 34.

What is claimed is:

1. An analyzer for a high voltage electrostatic coating system comprising:
    an analyzer body of a generally insulating material having a first and a second portion, the two portions being positionable relative to one another;
    a spherical conductive ball electrode removably received on said first portion of said analyzer body, contactable with test points of the electrostatic coating system, mounted on said first portion of the analyzer body;
    a plurality of high voltage resistors mounted in said second portion of the analyzer body;
    means for connecting the resistors in series;
    an ammeter having first and second terminals for coupling current therethrough, said first terminal being coupled to an end of said series-connected resistors;
    means for coupling said second terminal of said ammeter to an electrical ground; and
    means for selectively coupling said electrode to different resistors of said plurality of resistors dependent upon the relative position between said first and second portions of said analyzer body, wereby the resistance between said electrode and said ammeter may be varied to compensate for resistance variations among test points of an electrostatic coating system by varying the relative position between said first and second analyzer body portions.

2. The analyzer of claim 1 in which said second analyzer body portion is elongated and said resistors are elongated and disposed in generally the same direction as said second analyzer body portion.

3. The analyzer of claim 2 in which said means for connecting said resistors in series comprises a plurality of rods extending generally parallel to and spaced apart from said resistors, each rod having a pair of end connectors associated therewith, a first connector of each pair of connectors electrically connecting a first end of its associated rod to one of said resistors and the second connector of each pair of connectors at the other end of its associated said rod electrically connecting the rod to a different one of said resistors.

4. The analyzer of claim 2 in which the means for selectively coupling said electrode to a resistor comprises a receptacle mounted in the first analyzer body portion and electrically connected to the electrode, said selective coupling means further comprises a plurality of plugs each attached to a different resistor of said plurality of resistors, each plug being individually receivable for electrical connection within said receptacle with the relative positioning between said first and second analyzer body portions permitting electrical connection between said receptacle and selected different ones of said plugs.

5. The analyzer of claim 4 in which said first and second portions of said analyzer body are substantially cylindrical and coaxial, said two portions of said analyzer body being movable axially to an extended position in which said receptacle is free of a resistor plug and being rotatable about said axis in said extended axial position, said resistors being arrayed parallel to and radially spaced apart from the analyzer body axis, whereby rotation of said first body portion relative to said second body portion aligns said receptacle with a selected one of said resistor plugs to facilitate engagement of said receptacle and said selected one of said resistor plugs aligned therewith when said first and second body portions are urged together axially.

6. The analyzer of claim 1 in which said ammeter is scaled in terms of voltage.

7. The analyzer of claim 1 in which said means for coupling said second terminal of said ammeter to an electrical ground comprises a conductive handle for the analyzer electrically connected to said second terminal of said ammeter and a grounding cable attached to said handle at a first end and having, at its second end, means for connecting said cable to an earth ground.

8. The analyzer of claim 7 in which said ground cable is received on a spool rotatably mounted on the handle whereby the operative length of said cable may be varied by winding the cable onto said spool.

9. The analyzer of claim 2 in which the means for selectively coupling said electrode to a resistor comprises a first electrical connector mounted in the first analyzer body portion and electrically connected to the electrode, said selective coupling means further comprises a plurality of second electrical connectors each attached to a different resistor of said plurality of resistors, each second connection being relatively engageable with said first connector to establish an electrical connection therebetween with the relative positioning between said first and second analyzer body portions permitting electrical connection between said first electrical connector and selected different ones of said second electrical connectors.

10. An analyzer for obtaining an indication of the voltage at different test points in a high voltage electrostatic coating system where the test points are at different resistances to ground relative to one another, comprising:
    an analyzer body of a high voltage insulative material of a generally cylindrical shape having a sleeve portion telescopically received relative to a body portion, the two portions having a common axis for axial, telescopic motion relative to one another as well as for rotation relative to one another;
    a spherical conductive ball electrode, at least partially exposed for contacting the test points of the electrostatic coating system, removably mounted on said sleeve portion of said analyzer body at an end thereof distal from the body portion of said analyzer body;
    a plurality of high voltage resistors of generally cylindrical shape having axes parallel to the axis of said analyzer body and mounted in axial bores in the body portion of said analyzer body with the resistor axes being generally radially equidistant from said analyzer body axis;
    electrical conductors extending through the body portion of the analyzer body connecting the resistors in a series connection;
    an ammeter having a first terminal coupled to one end of the series connection of resistors and having a second terminal;
    an electrically conductive handle electrically connected to said second terminal of said ammeter;
    an electrical conductor electrically connected to said handle for coupling said handle to ground; and
    an electrically conductive element mounted inside said first portion of said analyzer body and electrically connected to said electrode, said element being spaced radially apart from said analyzer body axis generally the same distance as are said resistor axes, said element being positioned to selectively contact a resistor in said series of resistors with which it is angularly aligned due to rotation of said sleeve portion before the sleeve and body portions are telescoped together.

* * * * *